(12) United States Patent
Wakiyama et al.

(10) Patent No.: US 10,276,425 B2
(45) Date of Patent: Apr. 30, 2019

(54) SUBSTRATE PROCESSING SYSTEM

(71) Applicant: Tokyo Electron Limited, Tokyo (JP)

(72) Inventors: Terufumi Wakiyama, Kumamoto (JP);
Norihiro Ito, Kumamoto (JP); Jiro Higashijima, Kumamoto (JP); Satoshi Biwa, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 619 days.

(21) Appl. No.: 14/943,138

(22) Filed: Nov. 17, 2015

(65) Prior Publication Data
US 2016/0148827 A1    May 26, 2016

(30) Foreign Application Priority Data

Nov. 21, 2014 (JP) ................................ 2014-236102
Sep. 30, 2015 (JP) ................................ 2015-194880

(51) Int. Cl.
*H01L 21/67*    (2006.01)
*H01L 21/687*    (2006.01)

(52) U.S. Cl.
CPC .. *H01L 21/68728* (2013.01); *H01L 21/67051* (2013.01)

(58) Field of Classification Search
CPC ..................................... H01L 21/687–21/6875
See application file for complete search history.

(56) References Cited

U.S. PATENT DOCUMENTS

2007/0240824 A1* 10/2007 Kaneko ............. H01L 21/67051
156/345.11
2013/0320636 A1* 12/2013 Ogawa ............. H01L 21/68728
279/110

FOREIGN PATENT DOCUMENTS

| CN | 104051305 A | 9/2014 |
|----|----|----|
| JP | 4545180 B | 9/2010 |
| JP | 2011-071477 A | 4/2011 |
| JP | 3171521 U | 11/2011 |
| TW | 201400195 A | 1/2014 |
| TW | 201442062 A | 11/2014 |

\* cited by examiner

*Primary Examiner* — Dah-Wei D. Yuan
*Assistant Examiner* — Stephen A Kitt
(74) *Attorney, Agent, or Firm* — Abelman, Frayne & Schwab

(57) ABSTRACT

A substrate processing system includes: a holding plate provided to be rotatable around a vertical axis; a substrate holding member provided on the holding plate to hold a substrate; a rotary drive unit that rotates the substrate in a predetermined direction; and a processing fluid supply unit that supplies a processing liquid to the substrate. The substrate holding member includes a first side portion provided at a position facing the substrate and a second side portion and a third side portion that are adjacent to the first side portion. The first side portion includes a gripping portion configured to grip an end surface of the substrate. The second side portion forms a pointed end portion with the first side portion, and includes a liquid flow guide portion that guides the processing liquid to a lower side of the substrate after the processing liquid is supplied to the substrate.

12 Claims, 3 Drawing Sheets

SUBSTRATE PROCESSING SYSTEM

CROSS-REFERENCE TO RELATED APPLICATIONS

This application is based on and claims priority from Japanese Patent Application Nos. 2014-236102 and 2015-194880, filed on Nov. 21, 2014 and Sep. 30, 2015, respectively, with the Japan Patent Office, the disclosures of which are incorporated herein in their entirety by reference.

TECHNICAL FIELD

Exemplary embodiments disclosed herein relate to a substrate processing system.

BACKGROUND

Conventionally, a substrate processing system is known which supplies a processing liquid to a substrate such as, for example, a semiconductor wafer or a glass substrate, and processes the substrate. For example, Japanese Patent Laid-Open Publication No. 2011-071477 discloses a substrate processing system that includes a rotary table, and a substrate holding member attached to the rotary table and configured to grip the outer side of a substrate. The substrate processing system supplies a processing liquid such as, for example, a chemical liquid or pure water, to a surface of the substrate.

SUMMARY

In order to achieve the objects described above, the present disclosure provides a substrate processing system for processing a substrate. The substrate processing system includes: a holding plate provided to be rotatable around a vertical axis; a substrate holding member provided on the holding plate to hold a substrate; a rotary drive unit configured to rotate the substrate held by the substrate holding member in a predetermined direction; and a processing fluid supply unit configured to supply a processing liquid to the substrate held by the substrate holding member. The substrate holding member includes a first side portion provided at a position facing the substrate and a second side portion and a third side portion that are adjacent to the first side portion. The first side portion includes a gripping portion configured to grip an end surface of the substrate. The second side portion forms a pointed end portion with the first side portion, and includes a liquid flow guide portion that guides the processing liquid to a lower side of the substrate after the processing liquid is supplied to the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
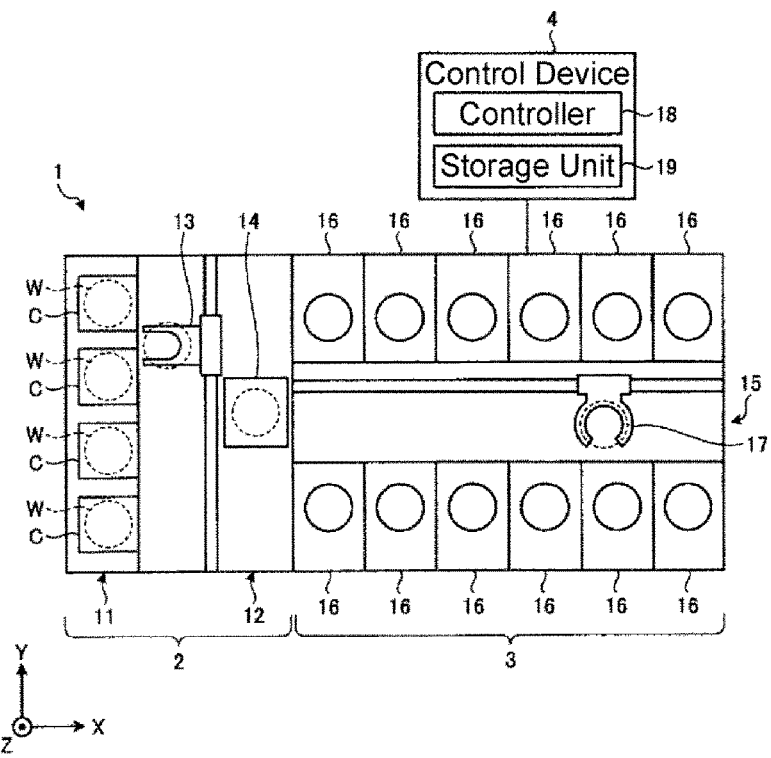
FIG. 1 is a plan view illustrating an outline of a substrate processing system according to an exemplary embodiment of the present disclosure.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

In the conventional substrate processing system, the processing liquid supplied to a rotating substrate impinges on the substrate holding member and is scattered to the upper side of the substrate when the processing liquid is splashed toward the outside of the substrate by a centrifugal force. The processing liquid scattered to the upper side of the substrate may be attached to the dried substrate, thereby causing contamination of the substrate.

In order to solve the problems described above, the present disclosure provides a substrate processing system for processing a substrate. The substrate processing system includes: a holding plate provided to be rotatable around a vertical axis; a substrate holding member provided on the holding plate to hold a substrate; a rotary drive unit configured to rotate the substrate held by the substrate holding member in a predetermined direction; and a processing fluid supply unit configured to supply a processing liquid to the substrate held by the substrate holding member. The substrate holding member includes a first side portion provided at a position facing the substrate and a second side portion and a third side portion that are adjacent to the first side portion. The first side portion includes a gripping portion configured to grip an end surface of the substrate. The second side portion forms a pointed end portion with the first side portion, and includes a liquid flow guide portion that guides the processing liquid to a lower side of the substrate after the processing liquid is supplied to the substrate.

In the substrate processing system, the liquid flow guide portion protrudes from the surface of the second side portion, the bottom surface of the liquid flow guide portion at a side close to the first side portion is disposed at a position higher than the substrate, and the bottom surface of the liquid flow guide portion at a side remote from the first side portion is disposed at a position lower than the substrate.

In the substrate processing system, the pointed end portion has an acute angle.

In the substrate processing system, the gripping portion protrudes from the surface of the first side portion and is narrow than a width of the first side portion.

In the substrate processing system, the gripping portion is formed in a concave shape on a surface of the first side portion.

In the substrate processing system, the gripping portion includes a concavely curved portion that is in contact with an end edge of the substrate to grip the substrate.

In the substrate processing system, the substrate holding member includes a columnar first main body that has a substantially quadrangular shape in plan view, and a columnar second main body that has a substantially triangular shape in plan view. The second main body includes the first side portion, the second side portion, and the third side portion, the first side portion and the third side portion are formed continuously to a side face of the first main body, and the second side portion including the liquid flow guide portion is formed along a diagonal line of the first main body.

In the substrate processing system, the substrate holding member includes a plurality of claw portions that are provided with spaces formed therebetween in a rotating direction of the substrate to hold the substrate, and the first to third side portions are formed on at least one of the claw portions.

In the substrate processing system, the substrate holding member includes a plurality of claw portions that are provided with spaces formed therebetween in a rotating direction of the substrate to hold the substrate, and the first to third side portions are formed on all of the claw portions.

In the substrate processing system, the spaces between the plurality of claw portions are formed to be parallel with each other.

In the substrate processing system, the spaces of the plurality of claw portions are formed to be gradually widened toward a rear side.

In the substrate processing system, the spaces between the plurality of claw portions are formed such that the gripping portion formed on at least one of the claw portions grips the substrate.

After having been supplied to the substrate, the processing liquid is suppressed from being attached to a dried substrate so that contamination of the substrate can be prevented.

FIG. 1 is a plan view illustrating an outline of a substrate processing system according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a controller 18 and a storage unit 19. The storage unit 19 stores a program that controls various processings performed in the substrate processing system 1. The controller 18 controls the operations of the substrate processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken-out wafer W on the delivery unit 14. The wafer W placed on the delivery unit 14 is taken out from the delivery unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. The wafer W processed and placed on the delivery unit 14 returns to the carrier C of the carrier placing section 11 by the substrate transfer device 13.

Figure 2:
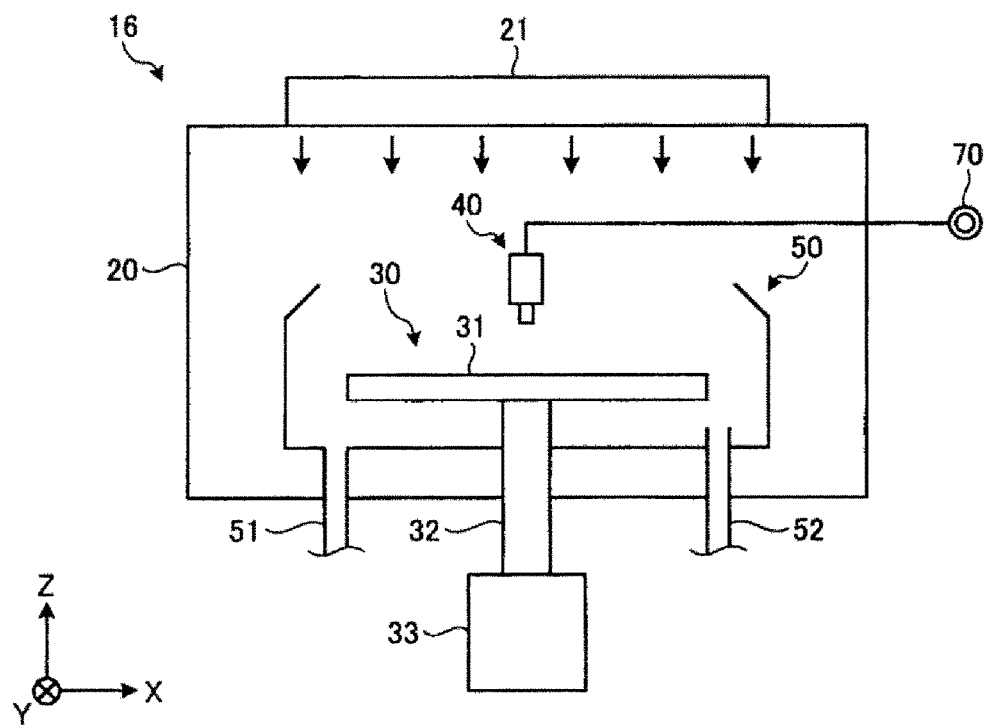
FIG. 2 is a vertical sectional view illustrating an outline of a processing unit according to the present exemplary embodiment.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow in the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing fluid onto the wafer W. The processing fluid supply unit 40 is connected to a processing fluid supply source 70.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside of the processing unit 16.

Because a substrate holding mechanism well-known in the art (e.g., disclosed in Japanese Patent Laid-Open Publication No. 2011-071747 may be used, descriptions on details of each constituent element of the substrate holding mechanism 30 will be omitted.

Figure 3:
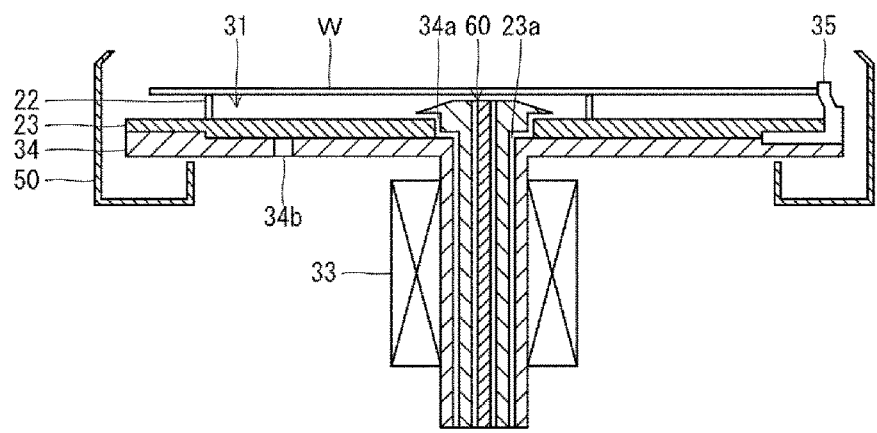
FIG. 3 is a vertical sectional view illustrating a configuration of the processing unit of the present disclosure.

Next, a specific configuration of the holding unit 31 will be described with reference to FIG. 3.

The holding unit 31 includes a disc-shaped holding plate 34 configured to be rotatable in a predetermined direction around a vertical axis, a substrate holding member 35 configured to hold a wafer W from a lateral side, and a lift pin plate 23 that includes a lift pin 22 configured to support the wafer W from a lower side. In addition, the holding unit 31 includes a second processing fluid supply unit 60 formed to penetrate each of a through hole 34a formed in the central portion of the holding plate 34 and a through hole 23a formed in the central portion of the lift pin plate 23. The second processing fluid supply unit 60 supplies a processing liquid such as, for example, pure water or a chemical liquid, to the rear surface of the wafer W held by the holding plate 34.

The holding plate 34 includes a through hole 34b that is formed at or adjacent to the outer periphery thereof. Even if the processing liquid infiltrates from a gap between the lift pin plate 23 and the holding plate 34, the processing liquid is discharged from the through hole 34b.

Figure 4A:
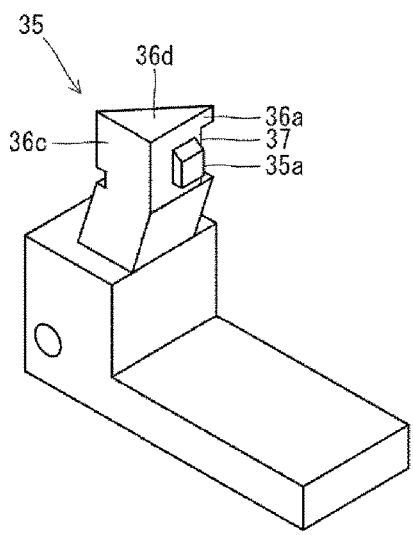
FIGS. 4A and 4B are perspective views illustrating a substrate holding unit of the present disclosure in detail.
Figure 4B:
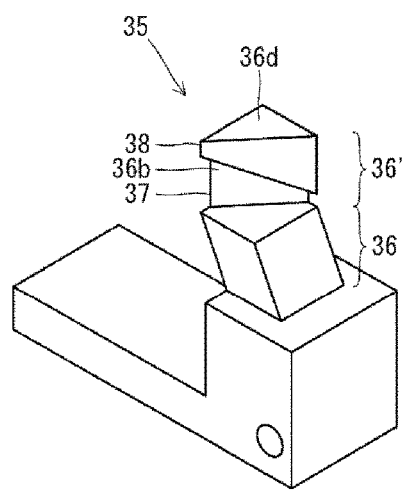

As illustrated in FIGS. 4A and 4B, the substrate holding member 35 includes a columnar first main body 36 and a columnar second main body 36' disposed on the first main body 36. The first main body 36 has a substantially quadrangular shape in plan view. In addition, the second main body 36' has a substantially triangular shape in plan view. The second main body 36' has a first side portion 36a at a position facing the wafer W. The first side portion 36a includes a gripping portion 35a configured to grip an end surface of the wafer W on the surface thereof. In addition, the second main body 36' includes a second side portion 36b, a third side portion 36c, and a top portion 36d that are adjacent to the first side portion 36a. The second side portion 36b is formed adjacent to the first side portion 36a at the rotating direction side of the wafer W (substrate holding member 35), and an acute-angled pointed end portion 37 is formed between the second side portion 36b and the first side portion 36a. In addition, a liquid flow guide portion 38 to be described later is provided on the surface of the second side portion 36b. The pointed end portion 37 is formed in a sharp shape toward the rotation direction of the wafer W (substrate holding member 35).

The gripping portion 35a protrudes from the surface of the first side portion 36a toward the rotation center of the wafer W (substrate holding member 35), and is disposed in the vicinity of the pointed end portion 37 to support the wafer W with the top surface thereof. The gripping portion 35a has a width narrower than the width of the first side portion 36a, and the height of the gripping portion 35a is reduced toward the protruding tip end thereof. The peripheral edge of the wafer W is supported by the top surface of the gripping portion 35a. By this, it is possible to reduce a contact portion of the gripping portion 35a with the wafer W as much as possible, and to suppress the processing liquid from remaining on the contact portion to generate particles.

The second side portion 36b includes a liquid flow guide portion 38 configured to guide the processing liquid to the lower side of the wafer W. The liquid flow guide portion 38 protrudes from the surface of the second side portion 36b, and includes a bottom face 38a that is a downwardly directed face in the liquid flow guide portion 38. In addition, the processing liquid is guided by the surface of the bottom face 38a. That is, the bottom face 38a is disposed at a position higher than the top surface of the wafer W supported on the gripping portion 35a at the side close to the first side portion 36a, and disposed at a position lower than the top surface and bottom surface of the wafer W supported on the gripping portion 35a at the side remote from the first side portion 36a (the third side portion 36c side). The bottom face 38a is formed as an inclined surface that is inclined downwardly as going away from the wafer W. The processing liquid splashed from the rotating wafer W is guided by the liquid flow guide portion 38 to the lower side of the wafer W and flows toward a recovery cup 50. The processing liquid collected by the recovery cup 50 is discharged from the drain port 51. Meanwhile, because the bottom side of the end of the first side portion 36a is formed in a cutout shape when viewed from the first side portion 36a side, the processing liquid is discharged from the cutout portion to the bottom face 38a of the liquid flow guide portion 38.

Next, descriptions will be made on the operation of the processing unit 16 configured as described above. First, the lift pin plate 23 is positioned at an upper position by a lift drive unit (not illustrated). Next, a wafer W is transferred from the outside of the processing unit 16 to the processing unit 16 by the substrate transfer device 17, and the wafer W is placed on the lift pins 22 of the lift pin plate 23.

The lift pin plate 23 is lowered, and the wafer W is transferred to the holding unit 31 and held by the substrate holding member 35.

Next, in a state where the wafer W rotates, a processing liquid such as, for example, pure water or a chemical liquid is supplied from the processing fluid supply unit 40 toward the surface of the wafer W and a predetermined liquid processing is performed on the surface of the wafer W. Meanwhile, when the processing liquid is supplied from the processing fluid supply unit 40, the processing liquid may also be supplied from the second processing fluid supply unit 60 toward the rear surface of the wafer W.

The processing liquid supplied to the surface of the rotating wafer W flows toward the peripheral edge of the wafer W by the centrifugal force, and flows toward the recovery cup 50. Because the substrate holding member 35 exists in the peripheral edge of the wafer W, a part of the processing liquid may impinge against the substrate holding member 35 to be scattered to the upper side of the wafer W. However, because the substrate holding member 35 of the present exemplary embodiment includes the liquid flow guide portion 38 formed thereon, the processing liquid is guided downwardly by the liquid flow guide portion 38, rather than being scattered to the upper side of the wafer W. The processing liquid guided to the lower side of the wafer W flows toward the recovery cup 50. The processing liquid collected by the recovery cup 50 is discharged from the drain port 51.

After the cleaning process of the wafer W is performed for a predetermined length of time, the supply of the processing liquid is stopped, and a drying process of the wafer W is performed by rotating the wafer W. When the drying process is terminated, the lift drive unit (not illustrated) moves the lift pins 22 from the lower position to the upper position.

After the lift pin plate 23 is moved to the upper position, the wafer W placed on the lift pins 22 is taken out from the lift pins 22 by the substrate transfer device 17, and carried out to the outside of the substrate processing apparatus. In this way, a series of liquid processings on the wafer W are completed.

Figure 5A:
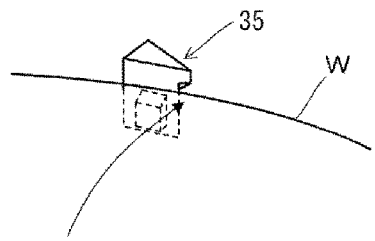
FIGS. 5A to 5C are perspective views illustrating a flow of a processing liquid that is guided by a liquid flow guide portion.
Figure 5B:
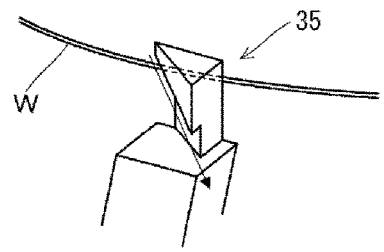
Figure 5C:
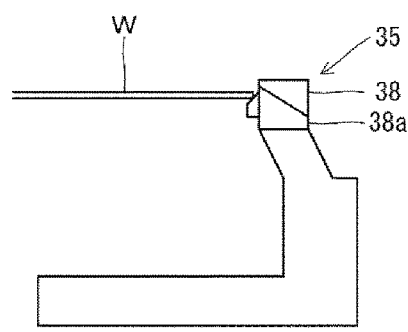

Hereinafter, descriptions will be made on a scattering prevention effect that is obtained by the liquid flow guide portion 38 with reference to FIGS. 5A to 5C.

When the processing liquid is supplied to a rotating wafer W, the processing liquid flows to draw a curve in the rotating direction of the wafer W due to the frictional force with the wafer W, and impinges against the pointed end portion 37. However, because the liquid flow guide portion 38 is formed on the second side portion 36b, the processing liquid is forcibly guided to the lower side of the wafer W by the rotating liquid flow guide portion 38 so that the processing liquid can be suppressed from being scattered to the upper side of the wafer W. Thus, the processing liquid, which has been supplied to the wafer W, can be suppressed from being attached to the dried wafer W, and thus the contamination of the wafer W can be suppressed.

The bottom face 38a, which is the downwardly directed face of the liquid flow guide portion 38, is disposed at a position higher than the wafer W supported on the gripping portion 35a at the side close to the first side portion 36a, and disposed at a position lower than the wafer W supported on the gripping portion 35a at the side remote from the first side portion 36a (the third side portion 36c side). By this, the entry of the processing liquid into the liquid flow guide portion 38 is facilitated so that the processing liquid can be suppressed from being scattered to the upper side of the wafer W. Thus, the processing liquid, which has been supplied to the wafer W, can be suppressed from being attached to the dried wafer W, and thus the contamination of the wafer W can be suppressed.

In addition, the liquid flow guide portion 38 includes an acute-angled pointed end portion 37. By this, the impinging energy received by the processing liquid that has impinged against the pointed end portion 37 is reduced so that the processing liquid hardly forms droplets. The processing liquid may be guided to the lower side of the wafer W by the liquid flow guide portion 38 in a liquid flow state without forming liquid droplets. By this, the risk of scattering of the processing liquid to the upper side of the wafer W can be reduced. Thus, the processing liquid, which has been supplied to the wafer W, can be suppressed from being attached to the dried wafer W, and thus the contamination of the wafer W can be suppressed.

In addition, when the processing liquid has been supplied to the rear surface of the wafer W, a part of the processing liquid supplied to the rear surface may flow along the inclination of the gripping portion 35a to be scattered to the upper side of the wafer W. However, even if the processing liquid has flowed along the inclination of the gripping portion 35a after it was supplied to the wafer W, the processing liquid is guided to the lower side of the wafer W by the liquid flow guide portion 38. Thus, the processing liquid, which has been supplied to the wafer W, can be suppressed from being attached to the dried wafer W without being scattered to the upper side of the wafer W. In addition, the width of the gripping portion 35a is narrower than the width of the first side portion 36a. Thus, the amount of the processing liquid flowing along the inclination of the gripping portion 35a can be reduced, and thus the contamination of the wafer W can be suppressed.

The substrate holding member 35 includes the columnar first main body 36 that has a substantially quadrangle shape in plan view, and the columnar second main body 36' that is continuously installed from the first main body 36 and has a substantially triangular shape in plan view. The second main body 36' has a side face that is composed of the first side portion 36a, the second side portion 36b, and the third side portion 36c. In addition, the first side portion 36a and the third side portion 36c are formed continuously to the side face of the first main body 36, and the second side portion 36b including the liquid flow guide portion 38 is formed along a diagonal line of the first main body 36. By this, the liquid flow guide portion 38 may be configured with a simple structure.

Meanwhile, the substrate processing system of the present exemplary embodiment is not limited to the above-described aspect, and various modifications may be applied thereto.

For example, the liquid flow guide portion 38 formed on the substrate holding member 35 may have a groove shape which may have a recessed shape, a "V" shape, or a "U" shape in cross-sectional view.

In addition, the second main body 36' may have a trapezoidal shape, a diamond shape, or a parallelogram shape in plan view.

Figure 6A:
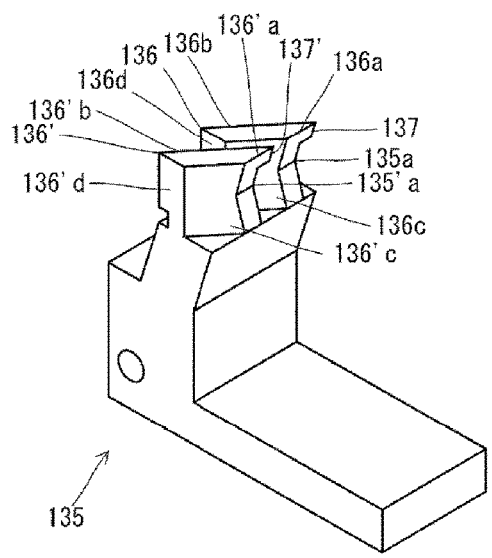
FIGS. 6A and 6B are perspective views illustrating another substrate holding unit in detail.
Figure 6B:
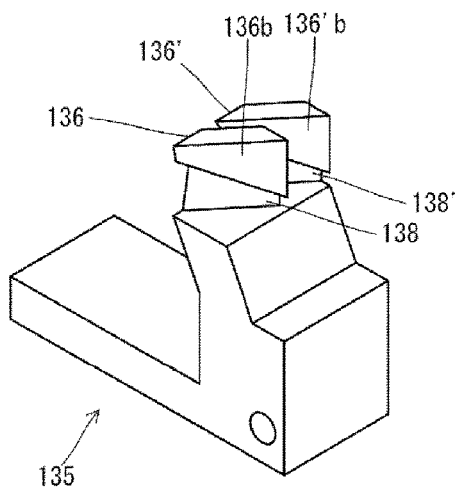

In addition, as illustrated in FIGS. 6A and 6B, the substrate holding member 135 includes a plurality of (here, two) claw portions 136, 136' that are provided with predetermined spaces formed therebetween in the rotating direction of a wafer W so as to hold the wafer W. Each claw portion 136, 136' is formed with a first side portion 136a, 136'a, a second side portion 136b, 136'b, and a third side portion 136c, 136'c. On the surface of the first side portion 136a, 136'a, a gripping portion 135a, 135'a to be abutted on the wafer W is formed in a concave shape. The gripping portion 135a, 135'a holds the wafer W by causing the concavely curved portion (the deepest portion) thereof to be in contact with the peripheral end edge of the wafer W. The second side portion 136b, 136'b includes a pointed end portion 137, 137' that is formed between the second side portion 136b, 136'b and the first side portion 136a, 136'a, and a liquid flow guide portion 138, 138' is formed on the surface of the second side portion 136b, 136'b so as to guide the processing liquid to the lower side of the wafer W. Meanwhile, on the substrate holding member 135, fourth side portions 136d, 136'd are formed between the second side portions 136b, 136'b and the third side portions 136c, 136'c, respectively. However, the substrate holding member 135 may be formed in a shape that does not include the fourth side portions 136d, 136'd by interconnecting the rear ends of the second side portions 136b, 136'b and the rear ends of the third side portions 136c, 136'c, respectively.

Because a plurality of claw portions 136, 136' to hold the wafer W are provided on the substrate holding member 135 as described above, it is possible to reduce the area against which the processing liquid flowing along the wafer W impinges (the area of the gripping portions 135a, 135'a) so that the scattering of the processing liquid can be suppressed. In particular, because each gripping portion 135a, 135'a is formed in a concave shape, it is possible to suppress the processing liquid from being scattered toward the upper side. Furthermore, by forming each gripping portion 135a, 135'a in a curved shape, the scattering of the processing liquid can be further suppressed.

In the substrate holding member 135, the first side portion 136a, 136'a, the second side portion 136b, 136'b, and the third side portions 136c, 136'c are formed in each of the claw portions 136, 136'. By this, the processing liquid can be guided well to the lower side of the wafer W by the liquid flow guide portion 138, 138' of each of the claw portions 136, 136'. Meanwhile, the first side portion 136a, 136'a, the second side portion 136b, 136'b, and the third side portion 136c, 136'c may be formed on any one of the claw portions 136, 136'. In addition, while parallel spaces are formed between the claw portions 136, 136' in the substrate holding member 135 by forming the third side portion 136c of the claw portion 136 and the second side portion 136'b of the claw portion 136' to be parallel with each other, the processing liquid may be allowed to smoothly flow by forming the space between the claw portions 136, 136' to be gradually widened toward the rear side. While two claw portions 136, 136' are formed in the substrate holding member 135, three or more claw portions may be formed. The space between the claw portions 136, 136' is set such that the entire width of the claw portions 136, 136' (the distance from the right end of the first side portion 136a of the claw portion 136 of the rightmost end to the left end of the first side portion 136'a of the claw portion 136' of the leftmost end in the case where the substrate holding member 135 is viewed from the front side) is larger than the width of a positioning cutout (notch) formed in a wafer W. Therefore, the gripping portion 135a, 135'a formed in any one claw portion 136, 136' is abutted on the outer peripheral end edge of the wafer W. Accordingly, it is possible to prevent a failure in gripping the wafer W which may be caused when any one gripping portion 135a, 135'a is caught in the notch of the wafer W.

In the substrate holding member 135, the surfaces at the lower side of the claw portions 136, 136' which face the wafer W (front surfaces) are formed as inclined surfaces of which the lower portions are inclined toward the outside of the wafer W. By this, for example, the processing liquid splashed from the wafer W may be caused to flow along the inclined surface of the first main body 36 to the outside of the wafer W. Thus, it is possible to reduce the risk of contamination of the wafer W which may be caused when the processing liquid is reattached to the wafer W. In addition, in the substrate holding member 135, a gap that communicates with the space between the claw portions 136, 136' is formed between the rear surface of the wafer W and the lower ends of the claw portions 136, 136' at the lower side of the concavely curved portions of the gripping portions 135a, 135'a (the portions that are in contact with the outer peripheral end edge of the wafer W). By this, for example, the processing liquid supplied to the rear surface side of the wafer W is caused to flow to the space between the claw portions 136, 136', so that it is possible to suppress the scattering of, for example, the processing liquid which may be caused when the processing liquid impinges on the inclined surfaces.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A substrate processing system comprising:
a holding plate provided to be rotatable around a vertical axis;
a substrate holding member provided on the holding plate to hold a substrate;
a rotary drive unit configured to rotate the substrate held by the substrate holding member in a predetermined direction; and
a processing fluid supply unit configured to supply a processing liquid to the substrate held by the substrate holding member,
wherein the substrate holding member includes a first side portion provided at a position facing a peripheral edge side of the substrate and a second side portion and a third side portion that are adjacent to the first side portion,
the first side portion includes a gripping portion configured to grip an end surface of the substrate, and
the second side portion forms a pointed end portion with the first side portion, and includes a liquid flow guide portion that guides the processing liquid along the second side portion to a lower side of the substrate after the processing liquid is supplied to the substrate
wherein the liquid flow guide portion protrudes from a surface of the second side portion, a bottom surface of the liquid flow guide portion at a side close to the first side portion is disposed at a position higher than the substrate, the bottom surface of the liquid flow guide portion at a side remote from the first side portion is disposed at a position lower than the substrate and faces a downward direction.

2. The substrate processing system of claim 1, wherein the pointed end portion has an acute angle.

3. The substrate processing system of claim 1, wherein, the gripping portion protrudes from a surface of the first side portion and is narrow than a width of the first side portion.

4. The substrate processing system of claim 1, wherein the gripping portion is formed in a concave shape on a surface of the first side portion.

5. The substrate processing system of claim 4, wherein the gripping portion includes a concavely curved portion that is in contact with an end edge of the substrate to grip the substrate.

6. The substrate processing system of claim 1, wherein the substrate holding member includes a columnar first main body that has a substantially quadrangular shape in plan view, and a columnar second main body that has a substantially triangular shape in plan view, and
the second main body includes the first side portion, the second side portion, and the third side portion, the first side portion and the third side portion are formed continuously to a side face of the first main body, and the second side portion including the liquid flow guide portion is formed along a diagonal line of the first main body.

7. The substrate processing system of claim 1, wherein the substrate holding member includes a plurality of claw portions that are provided with spaces formed therebetween, the claw portions being formed in a rotating direction of the substrate to hold the substrate, and the first to third side portions are formed on at least one of the claw portions.

8. The substrate processing system of claim 1, wherein the substrate holding member includes a plurality of claw portions that are provided with spaces formed therebetween in a rotating direction of the substrate to hold the substrate, and the first to third side portions are formed on all of the claw portions.

9. The substrate processing system of claim 7, wherein the spaces are formed between adjacent parallel portions of the plurality of claw portions.

10. The substrate processing system of claim 7, wherein the spaces between the plurality of claws are formed to be gradually widened toward a rear side.

11. The substrate processing system of claim 7, wherein the spaces between the plurality of claw portions are formed such that the gripping portion formed on at least one of the claw portions grips the substrate.

12. The substrate processing system of claim 1, wherein the liquid flow guide portion of the second side portion includes a bottom surface, the bottom surface facing a downward direction.

* * * * *